US008731890B2

(12) United States Patent
Fragachan et al.

(10) Patent No.: US 8,731,890 B2
(45) Date of Patent: May 20, 2014

(54) METHOD OF ESTIMATING WELL DISPOSAL CAPACITY (75) Inventors: Francisco Fragachan, Barcelona (ES); Adriana P. Ovalle, Cypress, TX (US); Talgat A. Shokanov, Almaty (KZ); Vyacheslav Anokhin, Moscow (RU); Andrea Alba, Houston, TX (US); Kenneth G. Nolte, Tulsa, OK (US)

(73) Assignee: M-I L.L.C., Houston, TX (US)

( * ) Notice: Subject to any disclaimer, the term of this patent is extended or adjusted under 35 U.S.C. 154(b) by 567 days.

(21) Appl. No.: 12/918,553

(22) PCT Filed: Feb. 3, 2009

(86) PCT No.: PCT/US2009/032946
§ 371 (c)(1),
(2), (4) Date: Aug. 20, 2010

(87) PCT Pub. No.: WO2009/105330
PCT Pub. Date: Aug. 27, 2009

(65) Prior Publication Data
US 2010/0332204 A1   Dec. 30, 2010

Related U.S. Application Data (60) Provisional application No. 61/030,877, filed on Feb. 22, 2008.

(51) Int. Cl.
*G06G 7/48* (2006.01)
*E21B 49/00* (2006.01)
(52) U.S. Cl.
USPC .......................................... 703/10; 166/250.1
(58) Field of Classification Search
USPC .......................................... 166/250.1; 703/10
See application file for complete search history.

(56) References Cited

U.S. PATENT DOCUMENTS

| 4,393,933 | A | * | 7/1983 | Nolte et al. | 166/250.1 |
| 5,050,674 | A | * | 9/1991 | Soliman et al. | 166/250.1 |
| 5,105,659 | A | * | 4/1992 | Ayoub | 73/152.39 |
| 5,442,950 | A | * | 8/1995 | Unalmiser et al. | 73/38 |
| 6,002,063 | A | * | 12/1999 | Bilak et al. | 588/17 |
| 6,394,194 | B1 | | 5/2002 | Queen et al. | |
| 7,063,147 | B2 | * | 6/2006 | Siebrits et al. | 166/250.1 |

(Continued)

OTHER PUBLICATIONS

Evaluation of the Influence of In-Situ Reservoir Conditions on the Geometry of Hydraulic Fractures Using a 3D Simulator by R.L. Dougherty et al, 1984, pp. 1-12, 1984, SPE 13275.*

(Continued)

*Primary Examiner* — Akash Saxena
(74) *Attorney, Agent, or Firm* — Osha Liang LLP (57) ABSTRACT A method for determining a maximum volume of drilling cuttings disposal in a formation, the method including inputting formation parameters into a simulator, simulating a formation during waste injection based on the formation parameters, determining a net pressure based on the simulating, determining a closure pressure increase based on the simulating, calculating a disposal volume based on the net pressure and the closure pressure, calculating a time interval of waste injection based on the calculated injection volume, and outputting at least one of the disposal volume and the time interval is disclosed. A method of optimizing a waste injection process, the method including simulating a formation based on input parameters, determining a closure pressure increase per unit slurry volume based on the simulation, calculating a disposal capacity of the selected formation, and outputting the disposal capacity is also disclosed.

17 Claims, 6 Drawing Sheets

(56) References Cited

U.S. PATENT DOCUMENTS

| | | | |
|---|---|---|---|
| 7,134,492 B2* | 11/2006 | Willberg et al. | 166/250.1 |
| 7,318,013 B2* | 1/2008 | Guo et al. | 703/2 |
| 7,440,876 B2* | 10/2008 | Geehan et al. | 703/2 |
| 7,478,020 B2* | 1/2009 | Guo et al. | 703/2 |
| 7,571,080 B2* | 8/2009 | Guo et al. | 703/2 |
| 7,698,065 B2* | 4/2010 | Moos et al. | 702/11 |
| 7,721,596 B2* | 5/2010 | Rogers et al. | 73/152.02 |
| 7,890,307 B2* | 2/2011 | Geehan et al. | 703/2 |
| 8,047,284 B2* | 11/2011 | Ramurthy et al. | 166/250.02 |
| 2004/0010373 A1* | 1/2004 | Smits et al. | 702/6 |
| 2006/0200328 A1* | 9/2006 | Guo et al. | 703/10 |
| 2006/0200329 A1* | 9/2006 | Guo et al. | 703/10 |
| 2007/0022802 A1* | 2/2007 | Rogers et al. | 73/53.01 |
| 2007/0197851 A1* | 8/2007 | Rogers et al. | 588/250 |
| 2008/0154554 A1* | 6/2008 | Guo et al. | 703/1 |
| 2008/0162094 A1* | 7/2008 | Geehan et al. | 703/2 |
| 2010/0314104 A1* | 12/2010 | Shokanov et al. | 166/250.1 |
| 2010/0332204 A1* | 12/2010 | Fragachan et al. | 703/6 |
| 2011/0120702 A1* | 5/2011 | Craig | 166/250.1 |

OTHER PUBLICATIONS

Development of a True 3D Hydraulic Fracturing Simulator by K. Yamamoto et al, 1999, pp. 1-10, SPE 54265.*

Ahmed S. Abou-Sayed et al., "Design Considerations in Drill Cuttings Re-Injection Through Downhole Fracturing," IADC/SPE 72308, Oct. 22-24, 2001, 9 pages.

Quanxin Guo et al., "Worldwide Drill Cuttings Injection Permitting Requirements and Guidelines," SPE 80587, Mar. 10-12, 2003, 8 pages.

International Search Report issued in PCT/US2009/032946, mailed on Sep. 17, 2009, 3 pages.

Written Opinion issued in PCT/US2009/032946, mailed on Sep. 17, 2009, 7 pages.

Examination Report issued in corresponding British Application No. GB1014704.9; Dated Oct. 24, 2012 (5 pages).

Examination Report issued in corresponding Australian Patent Application No. 2009215713; Dated Jun. 6, 2011 (2 pages).

First Office Action Filed in Corresponding Chinese Application No. 200980105992.1 on May 3, 2012 (7 pages).

Official Action issued in corresponding Eurasian Application No. 201070985 with English language communication reporting the same; Dated Nov. 18, 2011 (3 pages).

Examination Report issued in corresponding British Application No. GB1014704.9; Dated Feb. 2, 2012 (2 pages).

Second Examination Report issued in corresponding Australian Patent Application No. 2009215713; Dated Jul. 3, 2012 (4 pages).

Office Action issued in corresponding Canadian Application No. 2,716,018; Dated Apr. 10, 2013 (3 pages).

Second Office Action Filed in Corresponding Chinese Application No. 200980105992.1; Dated Jan. 21, 2013 (10 pages).

Third Examination Report issued in corresponding Australian Patent Application No. 2009215713; Dated Feb. 6, 2013 (4 pages).

Office Action issued in corresponding Indonesian Application No. W-00201003245 with English reporting thereof dated Sep. 7, 2013 (4 pages).

Office Action issued in corresponding Argentine Application No. P 09 01 00543 with English reporting thereof dated Nov. 11, 2013 (7 pages).

* cited by examiner

METHOD OF ESTIMATING WELL DISPOSAL CAPACITY

BACKGROUND OF INVENTION

1. Field of the Invention

Embodiments disclosed herein generally relate to methods of determining well disposal capacity. More specifically, embodiments disclosed herein generally relate to determining a maximum injection volume in a selected formation for a waste injection process.

2. Background Art

Waste Injection (WI) operation involves the collection and transportation of drilling waste from solids control equipment on a rig to a slurrification unit. The slurrification unit subsequently grinds the cuttings into small particles in the presence of a fluid to make a slurry. The slurry is then transferred to a slurry holding tank for conditioning. The conditioning process affects the rheology of the slurry, yielding a "conditioned slurry." The conditioned slurry is then pumped into a disposal well or through a casing annulus into sub-surface fractures in the formation (commonly referred to as the disposal formation) under high pressure. The conditioned slurry may be injected intermittently in batches into the disposal formation. The batch process typically includes injections of similar volumes of conditioned slurry and then waiting for a period of time (e.g., shutting-in time) after each injection. Each batch injection may last from a few hours to several days or even longer, depending upon the batch volume and the injection rate.

Batch processing (i.e., injecting conditioned slurry into the disposal formation and then waiting for a period of time after the injection) allows the fracture to close and dissipate, to a certain extent, the build-up of pressure in the disposal formation. However, the pressure in the disposal formation typically increases due to the presence of the injected solids (i.e., the solids present in the drill cuttings slurry).

With large-scale WI operations, release of waste into the environment must be avoided and waste containment must be assured to satisfy stringent governmental regulations. Important containment factors considered during the course of the operations include: the location of the injected waste and the mechanisms for storage; the capacity of an injection well or annulus; whether injection should continue in the current zone or in a different zone; whether another disposal well should be drilled; and the required operating parameters necessary for proper waste containment.

Modeling of WI operations and prediction of disposed waste extent are used to address these containment factors and to ensure the safe and lawful containment of the disposed waste. Modeling and prediction of fracturing is also used to study WI operation impact on future drilling, such as the required well spacing, formation pressure increase, etc. A thorough understanding of the storage mechanisms in WI operations may also be important for predicting the possible extent of the injected conditioned slurry and for predicting the disposal capacity of an injection well.

Accordingly, there exists a need for a more accurate assessment or estimations of well disposal capacity.

SUMMARY OF INVENTION

In one aspect, embodiments disclosed herein relate to a method for determining a maximum volume of drilling cuttings disposal in a formation, the method including inputting formation parameters into a simulator, simulating a formation during waste injection based on the formation parameters, determining a net pressure based on the simulating, determining a closure pressure increase based on the simulating, calculating a disposal volume based on the net pressure and the closure pressure, calculating a time interval of waste injection based on the calculated injection volume, and outputting at least one of the disposal volume and the time interval.

In another aspect, embodiment disclosed herein relate to a method for determining maximum storage capacity of a selected formation, the method including determining a closure pressure during a pre-determined time interval, determining a predicted pressure behavior, wherein the determining includes inputting formation parameters and an initial closure pressure into a simulator, simulating the selected formation during waste injection, and predicting a value of a closure pressure approximately equal to an overburden pressure, determining a disposal capacity based on the determining the predicted pressure behavior, and outputting the disposal capacity.

In yet another aspect, embodiments disclosed herein relate to a method of optimizing a waste injection process, the method including simulating a formation based on input parameters, determining a closure pressure increase per unit slurry volume based on the simulation, calculating a disposal capacity of the selected formation, and outputting the disposal capacity.

Other aspects and advantages of the invention will be apparent from the following description and the appended claims.

DETAILED DESCRIPTION

In one aspect, embodiments disclosed herein relate to methods of estimating storage capacity of a selected formation for drilling waste disposal. In another aspect, embodiments disclosed herein relate to methods of estimating storage capacity of a selected formation for drilling waste disposal based on actual waste injection data. In yet another aspect, embodiments disclosed herein relate to methods of estimating the time interval of waste injection.

Figure 1:
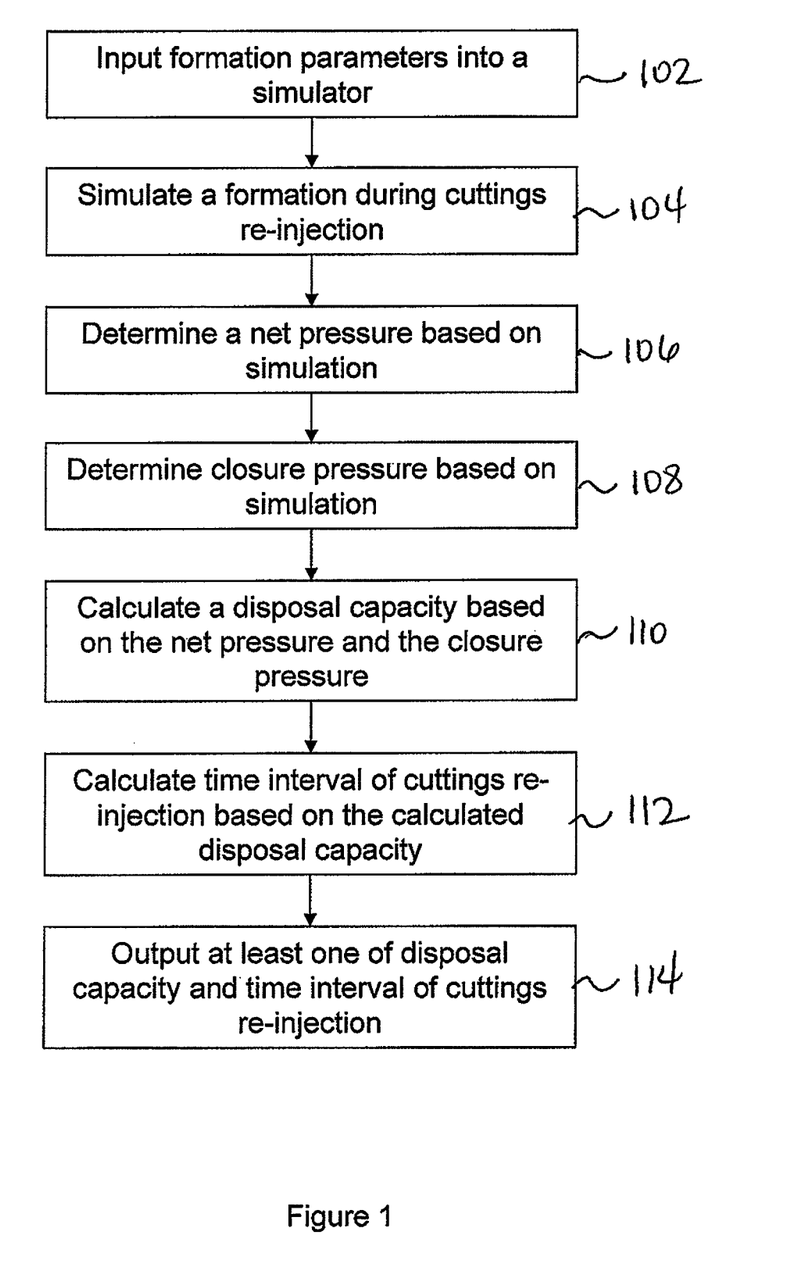
FIG. 1 shows a method of determining disposal capacity of a formation wherein actual pressure data is not available, in accordance with embodiments disclosed herein.

Referring now to FIG. 1, a method for determining a maximum volume of drilling cuttings disposal in a formation is shown, in accordance with embodiments disclosed herein. The maximum volume of drilling cuttings disposal in a formation, or a capacity of the selected formation, may be determined or estimated if actual data of the waste injection pressures is not available using the method shown in FIG. 1.

As shown in FIG. 1, formation parameters of a selected formation are input into a simulator 102. The simulator may include any simulator known in the art for simulating formation fracturing. In one embodiment, the simulator may include a three-dimensional hydraulic fracturing simulator. Commercially available hydraulic fracturing simulators include, for example, TerraFRAC® by TerraTek® (Salt Lake City, Utah), FracCADE® by Schlumberger (Houston, Tex.), and MFRAC™ by Meyer and Associates, Inc. (Natrona Heights, Pa.). The simulator may include numerical modeling, three-dimensional modeling, and may simulate the growth of fractures in a formation during waste injection.

Formation parameters may include geomechanical properties of the formation, for example Young's Modulus, Poisson's ratio, formation stresses, formation pressure, injection formation temperature, and leak-off coefficient. Leak-off, as used herein, refers to migration of a fluid into a fracture face. Additional formation parameters may include formation type, rock fracture toughness, formation strength, and plasticity. Formation parameters may be obtained from logging or coring devices, or other apparatus known in the art for determining properties of a formation, for example, logging-while-drilling (LWD) and measurement-while-drilling (MWD) apparatus.

After the formation parameters have been input into the simulator 102, a simulation is run 104, simulating a hydraulic fracturing of the selected formation during a waste injection process. In one embodiment, batch injection parameters may also be input into the simulator. Batch injection parameters may include, for example, the number of batches of waste injected into the formation, a volume of slurry (solid cuttings plus fluids) to be injected into the formation, and material properties of the slurry. For example, in one embodiment, an operator of the simulator may specify an injection of 600 barrels of slurry, wherein the slurry includes approximately 20% solids, for modeling or simulation of the hydraulic fracturing of the formation. One of ordinary skill in the art will appreciate that other combinations of batch injection parameters may be used or input depending on, for example, the selected formation and the amount of waste prepared for injection.

In one embodiment, the simulating of the formation during waste injection 104 may be used to determine a closure pressure, $P_{cl}$, of the formation fracture in accordance with a simulated pressure decline after pump shut-in. Alternatively, a net pressure, $P_{net}$, at the end of injection into the fracture may be determined 106 from the simulation, and then used to determine a closure pressure 108. An increase in closure pressure is proportional to the net pressure increase multiplied by a coefficient of 0.005. In other words, the closure pressure increase may be estimated to be approximately 0.5% of the net pressure increase. The coefficient used to determine the increase in closure pressure, namely 0.005 or 0.5%, corresponds to the percent volume of solids in a fracture fill fraction and has been practically derived from various WI projects. Thus, the closure pressure increase may be determined as shown in Equation 1 below:

$$P_{net} \times 0.005 = P_{cl} \text{ Increase} \qquad (1)$$

wherein net pressure is determined at the end of injection and closure pressure increase is determined per batch of injection. Thus, referring back to the example above, wherein a batch of injection of 600 barrels of slurry with 20% solids was entered into the simulator, the simulator may model or predict a net pressure of approximately 140 psi. Thus, in this example, the closure pressure may be determined to be approximately 0.7 psi.

Next, Equations 2-5 may be used to determine a disposal capacity or a maximum injection volume of slurry into a formation 110. In one embodiment, these calculations may be programmed into the simulator. Alternatively, a separate numerical simulator may be used to perform the following determinations. First, a volume of cuttings in slurry, $V_{ctgs}$, may be determined as shown in Equation 2.

$$\text{Slurry Batch Volume} \times \text{Percent Cuttings in Slurry} = V_{ctgs} \qquad (2)$$

Thus, continuing the previous example, for a slurry batch of 600 barrels of slurry, wherein the slurry contains 20% cuttings, the volume of cuttings in slurry is 120 barrels.

An increase of closure pressure per single volume of slurry injected, e.g., per 1 barrel of slurry, may then be determined as follows:

$$P_{cl} \text{ Increase per batch of injection}/V_{ctgs} = \text{Increase of } P_{cl} \qquad (3)$$

For example, as determined above, if the closure pressure increase per batch of injection of 600 barrels of slurry is 0.7 psi and the volume of cuttings in slurry is 120 barrels, then the increase of closure pressure per one barrel of cuttings volume injected is 0.00583 psi/bbl.

Next, the difference, $D_1$, between an overburden pressure, $P_{ovb}$, and an initial minimum stress of the formation for injection at initial closure pressure may be calculated. As used herein, overburden pressure refers to the pressure imposed on an area or point of interest in the subsurface by formation or rock overlying that area. The overburden pressure and the initial minimal stress may be determined or output from the hydraulic fracture simulation of the formation. For example, a hydraulic fracture simulation including the above example parameters, may result in an overburden pressure of 5,709 psi and an initial minimum stress of 4,318 psi. Thus, the difference between overburden pressure and initial minimum stress in the current example is 1,391 psi.

Thus, the disposal capacity of cuttings in the selected formation may be determined by Equation 4 below.

$$D_1/\text{Increase of } P_{cl} = \text{Cuttings Disposal Capacity} \qquad (4)$$

Referring to the example calculations above, wherein the difference in overburden pressure and initial minimum stress of the formation is 1,391 psi, and the increase of closure pressure per one barrel of slurry volume is 0.00583 psi/bbl, then the cuttings disposal capacity is 238,457 bbls.

Using the cuttings disposal capacity calculated in Equation 4, the disposal capacity of slurry in the selected formation may be determined, at 110, using Equation 5.

$$\text{Cuttings Disposal Capacity/Percent Cuttings in Slurry} = \text{Slurry Disposal Capacity} \qquad (5)$$

Thus, in the example above, with a cuttings disposal capacity of 238,457 bbls and a percent cuttings in slurry value of 20%, the slurry disposal capacity is 1,192,286 bbls.

A time interval for waste injection may be calculated, at 112, based on the calculated slurry disposal capacity. The time interval may be determined by dividing the determined slurry disposal capacity by an average time for injection. The average time for injection may be obtained by averaging the injection time for various historical waste injection processes, or may be a value known and used in the art as the average injection time of slurry. For example, an average time for a waste injection process may be approximately 1,500 barrels per day. Thus, in the above example, where the slurry disposal capacity is 1,192,286, the estimated time for injecting the determined slurry disposal capacity is 795 days.

In one embodiment, the hydraulic fracturing simulator or the numerical simulator may output at least one slurry disposal capacity and the time interval for waste injection, at 114. Based on the output, a waste injection process may be performed, injecting an amount of slurry into the formation corresponding to the determined and output slurry disposal capacity and/or time interval.

One of ordinary skill in the art will appreciate that the examples and values of parameters, estimated, assumed, and calculated above are simply illustrative of the method of determining well disposal capacity in accordance with embodiments disclosed herein, and are not intended to limit the scope of embodiments of the present disclosure.

Figure 2:
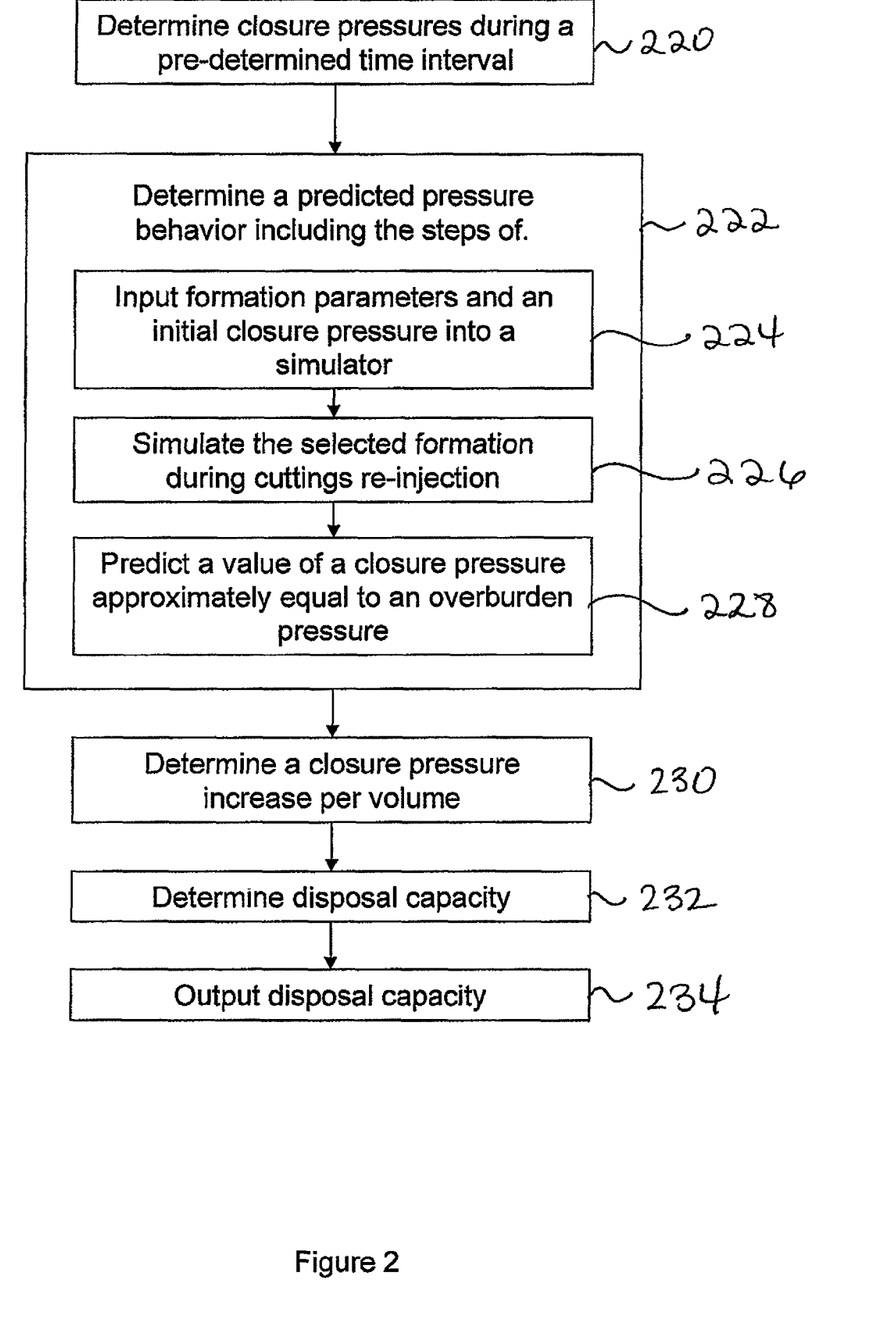
FIG. 2 shows a method of determining disposal capacity of a formation based on actual pressure data from a waste injection process, in accordance with embodiments disclosed herein.

Referring now to FIG. 2, a method for determining a maximum volume of drilling cuttings disposal in a formation is shown, in accordance with embodiments disclosed herein. The maximum volume of drilling cuttings disposal in a formation, or a capacity of the selected formation, may be determined or estimated based on real or actual data over a time interval of a waste injection process using the method shown in FIG. 2.

In accordance with the method of FIG. 2, closure pressures of a waste injection process are determined for a pre-selected time interval, at 220. For example, in one embodiment, the values of estimated closure pressures during one month or multiple months of injection may be determined based on empirical data measured during a waste injection process. Empirically determined pressure closures may be determined by any method know in the art, for example, by pressure gages and estimation of pressures based on pressure signatures during a waste injection process.

Next, a predicted pressure behavior of the fracture formation is determined, at 222. In one embodiment, the predicted pressure behavior may be determined by inputting formation parameters and actual closure pressures into a simulator 224, simulating the selected formation during waste injection 226, and predicting a value of a closure pressure approximately equal to an overburden pressure 228. In this embodiment, the simulator may include a simple predictive simulator, for example, a numerical simulator, that is capable of generating or predicting a trend based on entered data, for example empirical data.

In one embodiment, formation parameters input into the simulator 224 may include, for example, Young's Modulus, Poisson's ratio, formation stresses, formation pressure, injection formation temperature, and leak-off coefficient, formation type, rock fracture toughness, formation strength, and plasticity. The actual closure pressures input into the simulator may correspond to time values during the pre-selected time interval of the waste injection process. The simulator may then be run 226 to generate a predicted trend of closure pressures based on the actual or empirically determined closure pressures and corresponding time values.

The simulator may be configured such that the last value of the predicted trend 228 of closure pressures represents an overburden pressure, $P_{ovb}$. Additionally, the simulator may be configured or programmed to perform Equations 6-9 to determine the disposal capacity of the formation and a time interval for waste injection. Next, the difference, $D_2$, between the predicted overburden pressure and the highest empirically determined closure pressure, $P_{cl}$, may be calculated. A value of the closure pressure increase per unit of slurry volume (e.g., barrel) may then be determined, at 230, by dividing the difference between the predicted overburden pressure and the last empirically determined closure pressure, $D_2$, by the total volume of slurry injected during the pre-determined time interval, as shown in Equation 6 below.

$$D_2/\text{Total Volume Injected}=P_{cl} \text{ Increase per Volume} \qquad (6)$$

Next, the capacity of the well formation, or maximum injection volume, may be determined, at 232, by multiplying the difference between the overburden pressure and the highest empirically determined closure pressure, $D_2$, by the closure pressure increase per volume, as shown in Equation 7.

$$D_2 \times P_{cl} \text{ Increase per Volume}=\text{Capacity of Formation} \qquad (7)$$

The average injection volume per unit time may then be determined by dividing the total volume of slurry injected during the pre-selected time interval by the duration of time that the slurry was injected (e.g., days), as shown in Equation 8.

$$\text{Total Volume Injected/Slurry Injection Time}=\text{Average Injection Volume} \qquad (8)$$

Finally, the amount of time (e.g., the number of days) necessary to inject a slurry to reach a formation's disposal capacity may be determined by dividing the estimated capacity of formation, determined by Equation 7, by the average injection volume per unit time, determined by Equation 8, as shown in Equation 9.

$$\text{Capacity of Formation/Average Injection Volume}=\text{Time} \qquad (9)$$

In one embodiment, the numerical simulator may output the slurry disposal capacity and the time interval for waste injection, at 234. Additionally, the simulator may output the time interval for injecting the slurry into the formation. Based on the output, a waste injection process may be performed, injecting an amount of slurry into the formation corresponding to the determined and output slurry disposal capacity and/or time interval.

In accordance with another embodiment, a method of optimizing a disposal capacity of a selected formation for waste injection is disclosed. In this embodiment, simulation of a selected formation is performed based on input parameters. The input parameters may include, for example, formation parameters and batch injection parameters. The formation parameters may include, for example, geomechanical properties of the formation, such as Young's Modulus, Poisson's ratio, formation stresses, formation pressure, injection formation temperature, and leak-off coefficient. Additional formation parameters include formation type, rock fracture toughness, formation strength, and plasticity.

Once the formation is simulated, a closure pressure increase per unit slurry volume may be determined based on the simulation. In one embodiment, the closure pressure increase may be determined using Equation 3 above, if actual or empirical waste injection data is not available. In other embodiments, the closure pressure increase may be determined using Equation 6, if empirical data for a waste injection process is available.

From the closure pressure increase determinations, a disposal capacity of the selected formation may be calculated (see Equations 5 and 7), such that the disposal capacity of the formation is optimized. In one embodiment, optimization of disposal capacity refers to a maximum volume of slurry injection that may be injected in a selected formation without damaging the well, nearby wells, or planned wells trajectories. Typically, once the pressure inside well fractures reaches an overburden pressure, a horizontal fracture may 'twist' and fracture in a vertical direction. This twisting effect of a fracture is typically undesirable. Thus, optimization of a disposal capacity for a selected formation includes determining a volume of slurry that, when injected, does not reach or surpass an overburden pressure, a collapsing casing pressure, or a burst casing pressure.

From the determined disposal capacity, a time interval for injection of the slurry into the selected formation may also be determined (see Equations 8 and 9). The determined and optimized disposal capacity of the selected formation and/or the injection time interval may then be output to a user. Based on the output, a waste injection process may be performed, injecting an amount of slurry into the formation corresponding to the determined and output slurry disposal capacity and/or time interval.

Figure 3:
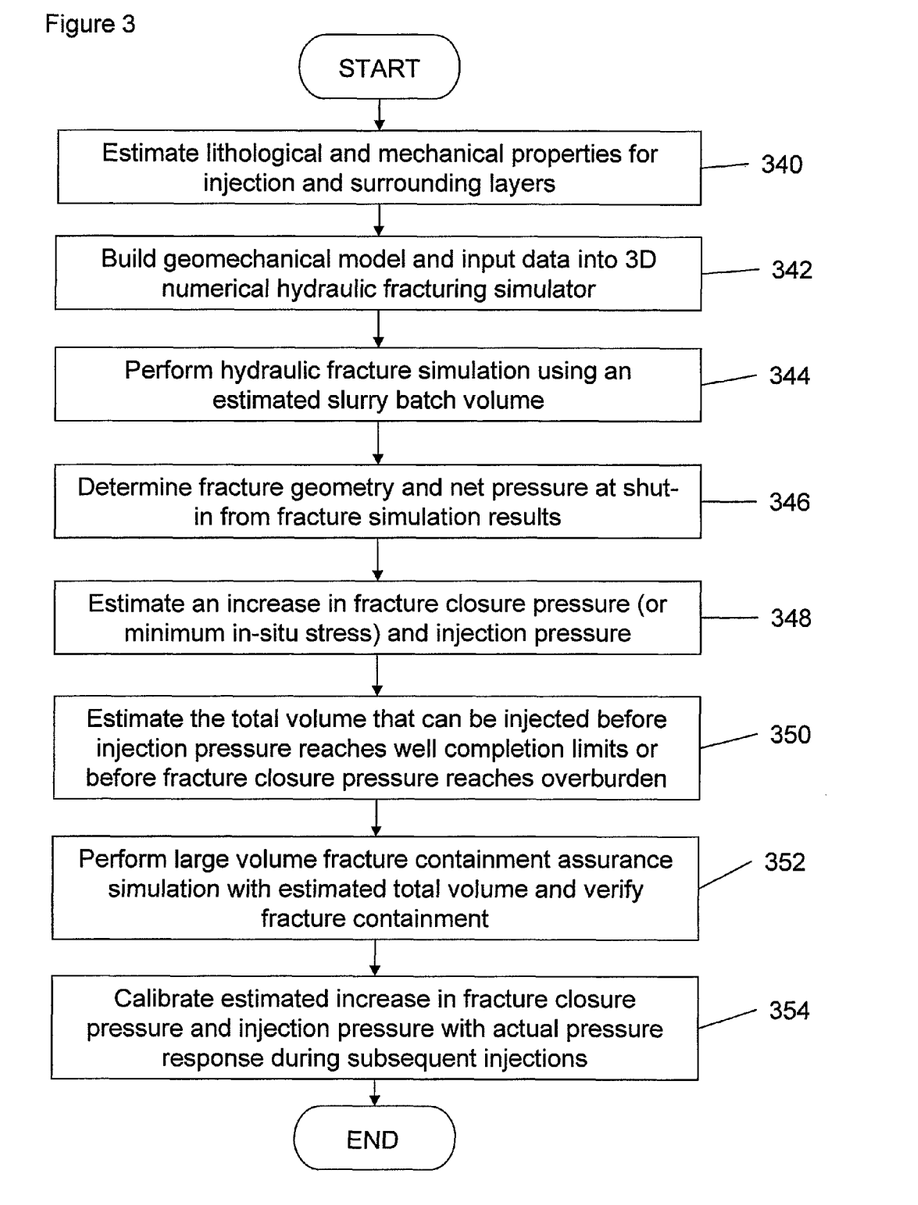
FIG. 3 shows a method of determining disposal capacity of a formation for waste injection operations in accordance with embodiments disclosed herein.
Figure 4:
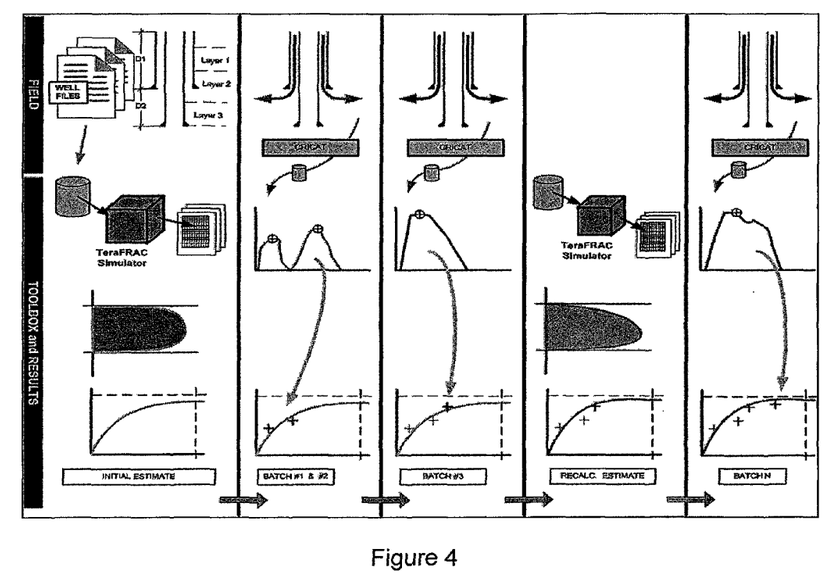
FIG. 4 shows a schematic overview of the method disclosed in FIG. 3.

Referring now to FIG. 3, a method of estimating waste disposal capacity of a subterranean formation for waste injection operations in accordance with embodiments of the present disclosure is shown. FIG. 4 shows a schematic overview of the method detailed in FIG. 3. In this embodiment, a maximum disposal capacity of an injection formation is determined by performing fracture simulations of the injection formation, as well as surrounding formations, to obtain fracture geometry and net pressure at shut-in. The maximum volume of drilling cuttings disposal in a formation, or a capacity of the selected formation, may be determined or estimated if actual data of the waste injection pressure is not available using the method shown in FIG. 3.

As shown in FIG. 3, formation parameters, including lithological and mechanical properties of the injection layer and the surrounding formation, are estimated 340. As described above, formation parameters may include geomechanical properties of the formation, for example Young's Modulus, Poisson's ratio, formation stresses, formation pressure, injection formation temperature, and leak-off coefficient. Additional formation parameters may include formation type, rock fracture toughness, formation strength, and plasticity. Formation parameters may be obtained from logging or coring devices, or other apparatus known in the art for determining properties of a formation, for example, LWD and MWD apparatus.

The formation parameters of the selected formation are then used to build a geomechanical model, and the model is input into a simulator 342. The simulator may include any simulator known in the art for simulating formation fracturing. In one embodiment, the simulator may include a three-dimensional hydraulic fracturing simulator. Commercially available hydraulic fracturing simulators include, for example, TerraFRAC® by TerraTek® (Salt Lake City, Utah), FracCADE® by Schlumberger (Houston, Tex.), and MFRAC™ by Meyer and Associates, Inc. (Natrona Heights, Pa.). The simulator may include numerical modeling, three-dimensional modeling, and may simulate the growth of fractures in a formation during waste injection.

After the formation parameters and geomechanical model have been input into the simulator 342, a simulation is run 344, simulating a hydraulic fracturing of the selected formation during a waste injection process. In one embodiment, batch injection parameters and slurry parameters may also be input into the simulator. Batch injection parameters may include, for example, the number of batches of waste injected into the formation, and a volume of slurry (solid cuttings plus fluids) to be injected into the formation. Slurry parameters include, for example, material properties of the slurry. In certain embodiments, batch injection parameters may be an estimated value selected based on previous injection experience of operators, engineers, etc. For example, in one embodiment, an operator of the simulator may specify an injection of 600 barrels of slurry, wherein the slurry includes approximately 20% solids, for modeling or simulation of the hydraulic fracturing of the formation. One of ordinary skill in the art will appreciate that other combinations of batch injection parameters may be used or input depending on, for example, the selected formation and the amount of cuttings prepared for injection.

Figure 5:
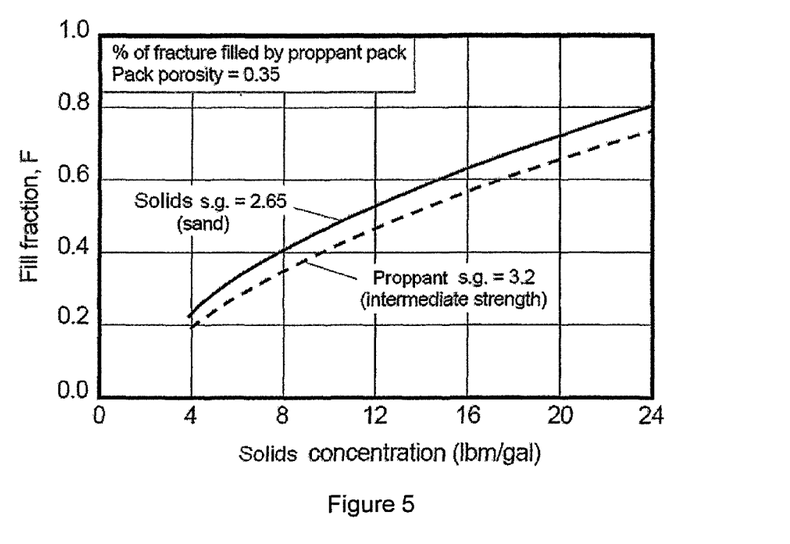
FIG. 5 is a graph of a fill fraction versus solids concentration for a slurry in accordance with embodiments disclosed herein.
Figure 6:
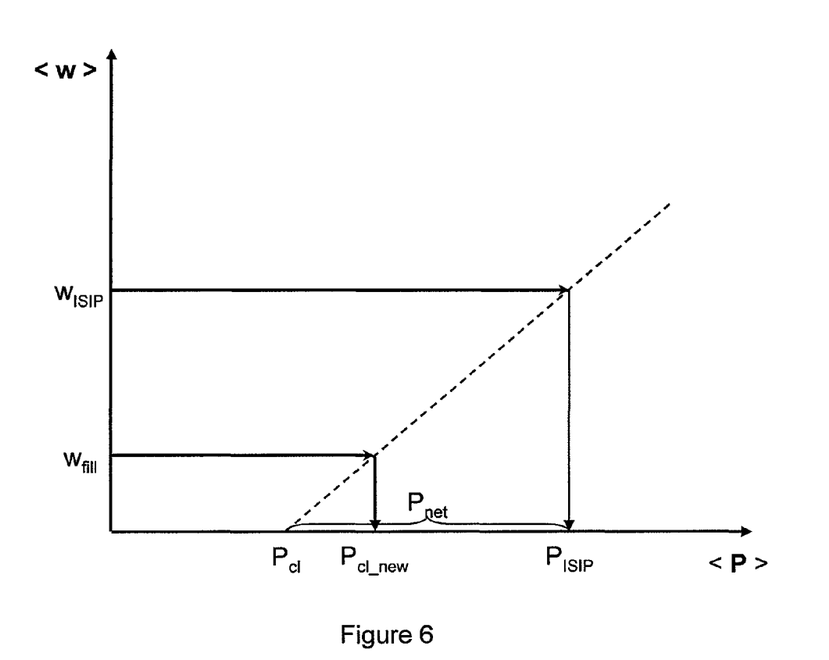
FIG. 6 is a graph of fill fraction versus pressure for a slurry in accordance with embodiments disclosed herein.

After the simulation is run 344, the simulation will output fracture simulation results based on the model and data entered into the simulator 342, 344. In one embodiment, the fracture simulation results may include net pressure and fracture geometry at the end of the simulated injection operation or shut-in 346. In some embodiments, the increase in the fracture closure pressure (i.e., minimum in-situ stress over the fracture height) may be proportional to a solids fill fraction in the fracture and net pressure at shut-in. This relationship is shown in FIG. 6, where w is a fraction and p is a pressure. Because the solids concentration in the slurry is constant with, in the example above, a 20% estimated solids volume, the solids fill fraction at shut-in is equal to 0.25%, as shown in FIG. 5. FIG. 5 illustrates calculated solids fill fraction in the fracture versus solids concentrations of the slurry injected for sand (equivalent to cuttings) and proppant (intermediate strength sand) at shut-in. An average formation porosity of 35% was used. Therefore, the increase in the fracture closure pressure from a single slurry batch may be estimated 348 as equal to the fill fraction (i.e., 0.25%) times the net pressure. The increase in fracture closure pressure may be estimated for each simulation performed.

Next, the capacity of the formation may be estimated 350 by determining the total volume that could be injected into the formation before the injection pressure reaches well completion limits or before the fracture closure pressure reaches overburden. To verify the fracture containment or capacity of the formation, an assurance simulation may then be performed 352 of a single batch large volume containment. The estimated total solids volume that could be injected into the formation (i.e., estimated based on the injection pressure, well completion limits, or overburden pressure) is input into the assurance simulation to verify the capacity.

After injection operations have commenced based on the estimated total volume or capacity of the formation, the estimated increase in fracture closure pressure may be calibrated 354 by comparing it to the actual fracture closure pressure determined from a pressure decline analysis (e.g., G-function or square root (SQRT) plots) and a defined adjustment coefficient.

An example of a method of estimating waste disposal capacity of a subterranean foimation for waste injection operations in accordance with embodiments of the present disclosure with reference to FIG. 3 is now provided. First, an increase in fracture closure pressure, $P_{cl}$, per each batch of slurry injected may be estimated by multiplying the net pressure at shut-in by the fill fraction, as shown in Equation 10:

$$\text{Increase of } P_{cl} \text{ per batch} = P_{net} \text{ at shut-in} \times \text{Fill Fraction} \quad (10)$$

In this example, for a slurry batch volume of 600 bbls, a net pressure at shut-in of 140 psi, and a fill fraction of 0.25% (see FIG. 5), the increase in fracture closure pressure is determined to be 0.35 psi.

Next, the volume of solids in slurry ($V_c$) may be determined by multiplying the slurry batch volume by the solids concentration, as shown in Equation 11.

$$V_c = \text{Slurry Batch Volume} \times \text{Solids Concentration} \quad (11)$$

Thus, for a slurry with approximately 20% solids concentration, the solids in slurry, $V_c$, is approximately 120 bbls (600 bbls×0.2).

The fracture closure pressure per one barrel of solids injected may then be estimated by dividing the increase in fracture closure pressure per one slurry batch injected by the volume of solids in slurry, as shown in Equation 12.

$$\text{Increase in } P_{cl} \text{ per barrel} = \text{Increase in } P_{cl} \text{ per batch}/V_c \quad (12)$$

Therefore, in this example, the increase in fracture closure pressure per one barrel of cuttings/solids injected is approximately 0.00292 psi/1 bbl (0.35 psi/120 bbls).

Next, the difference between overburden pressure, $P_{OB}$, and initial fracture closure pressure, $P_{cl\ initial}$ is determined using Equation 13.

$$\text{Difference } 1 = P_{OB} - P_{cl\ initial} \quad (13)$$

This difference is then compared to the difference between initial injection pressure, $P_{inj}$, and well completion limits, $P_{max}$, as given by Equation 14, to determine which difference is less.

$$\text{Difference } 2 = P_{max} - P_{inj} \quad (14)$$

The least determined difference, Difference 1 or Difference 2, may then be used for a pessimistic disposal capacity estimation. In the current example, the overburden pressure, initial fracture closure pressure, initial injection pressure, and well completion limits are as follows:

Overburden=5,709 psi
Initial Fracture Closure Pressure=4,318 psi
Initial Injection Pressure=5,100 psi
Maximum Well Completion Limits=10,000 psi In this example, the overburden pressure was estimated from logs, the initial fracture closure pressure and the initial injection pressure were obtained from actual pressure analysis, and the maximum well completion limits were provided by an operator based on tubing, casings, and wellhead maximum pressures.

Thus, Difference 1 (1,391 psi) is less than Difference 2 (4,900 psi), and may therefore be used to calculate a solids disposal capacity. The solids disposal capacity is equal to the least difference determined from Equations 13 and 14 divided by the increase in fracture closure pressure per barrel of solids injected determined by Equation 12, as shown in Equation 15.

$$\text{Solids Disposal Capacity} = \text{Difference/Increase in } P_{cl} \text{ per barrel} \quad (15)$$

Accordingly, the solids disposal capacity in the current example is equal to 476,370 bbls (1,391 psi/0.00292 psi/bbl).

Next, a single-batch large volume containment assurance simulation may be performed using a 3D hydraulic fracturing numerical simulator, as discussed above, and the estimated total solids disposal capacity from Equation 15 to verify the fracture containment.

Additionally, the total number of wells that could be injected based on the estimated solids disposal capacity may be calculated by dividing the estimated solids disposal capacity by the solids generation volume per well, as shown in Equation 16.

$$\text{Number of Wells} = \text{Solids Disposal Capacity/Well Solids Generation Volume} \quad (16)$$

Given that the solids generation volume per well is approximately 2,000 bbls, the number of wells that could be injected is approximately 238 wells (476,370/2,000).

Figure 7:
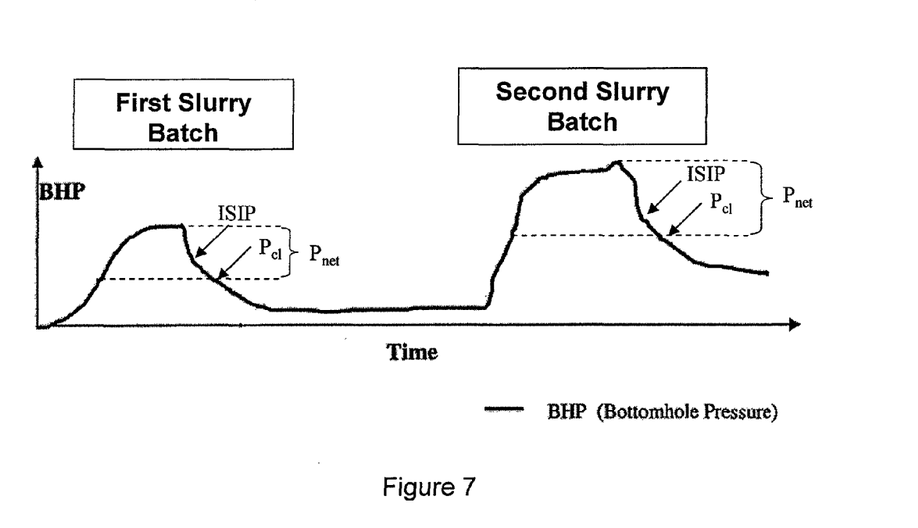
FIG. 7 is a graph of bottomhole pressure over time of two slurry batches in accordance with embodiments disclosed herein.
Figure 8:
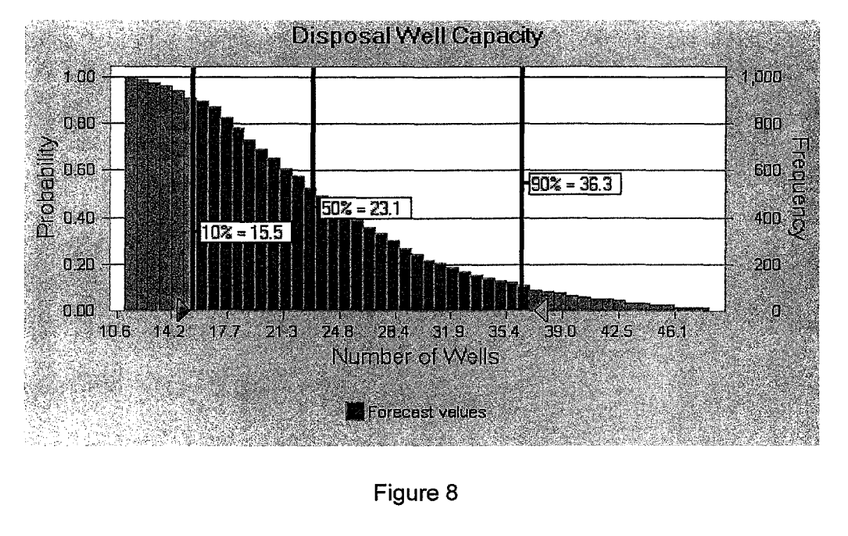
FIG. 8 is a graph of the probability or confidence range of solids disposal capacity and number of wells to be injected in accordance with embodiments disclosed herein.

The steps associated with Equations 10-16, and the simulations used to determine such data, may be performed for other anticipated slurry batch volumes as necessary. Each subsequent slurry batch may result in varying bottomhole pressures, as shown in FIG. 7. Using the results from the simulations and above steps, a confidence range (e.g., P10, P50, and P90) of solids disposal capacity and number wells that could be injected may be determined using any method known to those in the art. FIG. 8 is a graph showing the probability or confidence range of solids disposal capacity and number of wells in accordance with one embodiment of the present disclosure.

After injection operations have commenced, the estimated increase in fracture closure pressure $P_{cl}$ may be calibrated with the actual fracture closure pressure inferred from a decline analysis. An adjustment coefficient may be defined to apply to current or future simulations, as shown in Equation 17.

$$\text{Adjustment Coefficient} = P_{cl\ Estimated}/P_{cl\ Actual} \quad (17)$$

For example, for an estimated fracture closure pressure of 4,322 psi and an actual fracture closure pressure of 4,360 psi, the adjustment coefficient is 0.991 (4,322 psi/4,360 psi).

In one embodiment, outputs of the methods disclosed herein may include outputs of closure pressures, overburden pressures, disposal capacity, and time intervals. Types of outputs include graphical representation of the information, for example, pressure trends, or graphical representations of the formation showing the disposal capacity. Additionally, the outputs may include numerical and tabular displays.

Advantageously, embodiments disclosed herein provide methods for determining a maximum or optimal injection volume in a selected formation for a waste injection process. In some embodiments, methods of calibrating or determining parameters of hydraulic fractures initiated in a formation during a waste injection process may also be provided. Embodiments disclosed herein may advantageously provide an estimate of the time of slurry injection in a selected formation before reaching overburden and/or before reaching burst casing pressure of the well. Further, embodiments disclosed herein may advantageously provide a method of determining disposal capacity of a formation without determining the geometry of the fracture(s).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed:

1. A method for determining a maximum volume of drilling cuttings disposal in a formation, the method comprising:
    inputting formation parameters into a simulator;
    simulating a formation during waste injection based on the formation parameters;
    determining a net pressure based on the simulating;
    determining a closure pressure increase based on the simulating;
    calculating a disposal volume based on the net pressure and the closure pressure, wherein the calculating a disposal volume comprises determining a difference between an overburden pressure and an initial minimum stress of the formation at an initial closure pressure;
    calculating a time interval of waste injection based on the calculated disposal volume; and
    outputting at least one of the disposal volume and the time interval, wherein the calculating the disposal volume comprises calculating a maximum injection volume before reaching an overburden pressure.

2. The method of claim 1, wherein the formation parameters comprise logging and coring data.

3. The method of claim 1, further comprising injecting a volume of slurry into the formation approximately equal to the calculated disposal volume.

4. The method of claim 1, wherein the formation parameters include at least one selected from Young's modulus, Poisson's ratio, formation pressure, injection formation temperature, and leak-off coefficient.

5. The method of claim 1, wherein the simulating comprises simulating a three-dimensional hydraulic fracture of the formation.

6. The method of claim 1, further comprising inputting batch injection parameters into the simulator.

7. The method of claim 1, wherein the determining a closure pressure increase comprises determining a volume of cuttings in slurry.

8. A method for determining maximum storage capacity of a selected formation, the method comprising:
   determining a closure pressure during a pre-determined time interval;
   determining a predicted pressure behavior, wherein the determining comprises:
      inputting formation parameters and an initial closure pressure into a simulator;
      simulating the selected formation during waste injection; and
      predicting a value of a closure pressure approximately equal to an overburden pressure;
   determining a disposal capacity based on the determining the predicted pressure behavior,
      wherein the determining disposal capacity comprises:
         determining a pressure closure increase per unit volume of slurry; and
         determining a difference between the overburden pressure and an empirically determined closure pressure; and
   outputting the disposal capacity.

9. The method of claim 8, wherein the determining a predicted pressure behavior comprises generating a trend of closure pressures based on empirical data.

10. The method of claim 8, further comprising determining a time interval of waste injection based on the calculated injection volume.

11. The method of claim 8, further comprising injecting a volume of slurry into the formation approximately equal to the disposal capacity.

12. The method of claim 8, wherein the determining a closure pressure during a pre-determined time interval comprises obtaining empirical data of a historical waste injection process.

13. The method of claim 8, wherein the formation parameters include at least one of the group consisting of Young's modulus, Poisson's ratio, formation pressure, injection formation temperature, and leak-off coefficient.

14. A method of optimizing a waste injection process, the method comprising:
   simulating a formation based on input parameters;
   determining a closure pressure increase per unit slurry volume based on the simulation;
   calculating a maximum disposal capacity of the simulated formation; and
   outputting the disposal capacity, wherein the calculating a disposal capacity of a selected formation comprises determining a difference in overburden pressure and an initial closure pressure.

15. The method of claim 14, wherein the input parameters comprise at least one selected from formation parameters and batch injection parameters.

16. The method of claim 14, further comprising performing a fracture assurance simulation with calculated disposal capacity.

17. The method of claim 14, further comprising calibrating the determined closure pressure increase based on actual pressure response during injection operation.

* * * * *